(12) United States Patent  
Matsumura et al.

(10) Patent No.: US 6,370,750 B1
(45) Date of Patent: Apr. 16, 2002

(54) COMPONENT AFFIXING METHOD AND APPARATUS

(75) Inventors: Nobuya Matsumura, Kyoto; Shoji Sato, Neyagawa; Akihiro Yamamoto, Kobe; Yoshifumi Kitayama, Hirakata; Yoichi Nakamura, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/807,967

(22) PCT Filed: Oct. 18, 1999

(86) PCT No.: PCT/JP99/05737

§ 371 Date: Jun. 25, 2001

§ 102(e) Date: Jun. 25, 2001

(87) PCT Pub. No.: WO00/25349

PCT Pub. Date: May 4, 2000

(30) Foreign Application Priority Data

Oct. 27, 1998 (JP) ............................................. 10-304883

(51) Int. Cl.⁷ .......................... H01R 43/00; B32B 31/00
(52) U.S. Cl. ......................... 29/33 M; 29/831; 156/286; 156/494; 156/552
(58) Field of Search ................. 29/33 M, 33 K, 29/831, 842; 206/714; 156/285, 391, 286, 229, 494, 552, 64; 438/464

(56) References Cited

U.S. PATENT DOCUMENTS

| 4,714,511 | A | * | 12/1987 | Nakao ........................ 156/285 |
| 4,787,951 | A | * | 11/1988 | Okamoto ..................... 156/285 |
| 5,403,412 | A | * | 4/1995 | Hidaka et al. ................ 156/64 |
| 5,448,450 | A | * | 9/1995 | Burns ........................ 361/713 |
| 5,516,026 | A | * | 5/1996 | Ariye et al. ................. 228/6.2 |
| 5,908,114 | A | * | 6/1999 | Acthouse et al. ............. 206/714 |
| 6,007,654 | A | * | 12/1999 | McKenna ............... 156/785 X |
| 6,022,443 | A | * | 2/2000 | Rajala et al. ........... 156/552 X |
| 6,129,811 | A | * | 10/2000 | McKenna et al. ...... 156/285 X |

FOREIGN PATENT DOCUMENTS

| JP | 59-152639 | * | 8/1984 | ................. 438/464 |
| JP | 60-236242 | * | 11/1985 | ................. 156/652 |
| JP | 4-241441 | * | 8/1992 | ................. 156/552 |
| JP | 5-299425 | * | 11/1993 | ................. 29/33 M |
| JP | 10-242150 | * | 9/1998 | ................. 29/33 M |
| JP | 2000-124385 A | * | 4/2000 | ................. 156/286 |

* cited by examiner

Primary Examiner—William Briggs
(74) Attorney, Agent, or Firm—Greenblum & Bernstein. P.L.C.

(57) ABSTRACT

The component (2) is first brought into point or line contact with the sheet (3) so as to avoid entrapment of air therebetween. The contact area between the component and the sheet is then gradually spread until the entire bottom surface of the component is adhered to the sheet.

6 Claims, 6 Drawing Sheets

COMPONENT AFFIXING METHOD AND APPARATUS

TECHNICAL FIELD

The present invention relates to a method and apparatus for affixing a component to a sheet. More particularly, the present invention relates to the field of carrier tape packaging systems in which small electronic components, such as integrated circuit (IC) chips or die, are adhered lengthwise to a tape-like sheet for facilitating handling of the components in various subsequent operations.

BACKGROUND ART

Carrier tape packaging systems for electronic components are generally used for facilitating feeding of components in a component pick-and-place assembly line for manufacturing electronic circuit substrates by mounting electronic components on circuit boards.

FIG. 6 shows one example of existing prior art system for retaining unpackaged or bare IC chips within a carrier tape. The carrier tape 110 includes a punched support tape 104 that functions as a leader tape with a plurality of apertures 105 formed at a predetermined pitch, and an adhesive tape 103 adhered to the support tape 104. Bare IC chips 102 are affixed on the adhesive surface 103a of the adhesive tape 103 within each of the cavities formed by the apertures 105.

The process of affixing components on the carrier tape 110 is carried out such that bare IC chips 102 diced from a semiconductor wafer 101 are picked up by a suction nozzle 106 of a transfer robot 107 and transferred one by one onto the adhesive tape 103 of the carrier tape 110 that is fed intermittently and paused at the chip affixing station 108. In order to ensure that chips are stuck to the adhesive tape 103, a table-plate 109 is provided at the chip affixing station 108 for supporting the adhesive tape 103 from below.

The inventors of the present application have tried to apply the above described carrier tape packaging system in the process of forming metal bumps on electrodes of IC chips to be electrically connected to a circuit pattern of a mounting surface, or in the process of leveling such metal bumps to a predetermined height by pressing them. However, it has been found that defective bonds are frequently formed in these processes.

Extensive experiments conducted by the inventors have shown that air pockets exist between the flat surface of IC chips 102 and the adhesive tape 103, and these air pockets hinder the action of ultrasound that is applied for forming bumps by a wire bonding technique utilizing ultrasonic vibration.

It has further been discovered that the formation of such air pockets can be attributable to the method of affixing chips to the tape in which the flat surface of IC chips 102 is placed at one stroke on the adhesive tape 103 that is supported on the table plate 109 in a flat condition, by which air between the chip and tape is entrapped.

Accordingly, an object of the present invention is to provide a method of and an apparatus for affixing components to various forms of sheets without allowing air bubbles to form between the components and the sheets.

DISCLOSURE OF THE INVENTION

In order to achieve the above object, the present invention provides a method of affixing a component on a sheet characterized in that the component is first brought into point or line contact with the sheet in a predetermined point or line contact area, and said point or line contact area between the component and the sheet is then continuously spread until the component is adhered to the sheet.

According to the component affixing method of present invention, instead of face-to-face contact by which air tends to be entrapped, the sheet is at first brought into a point or line contact with the component, so as to avoid formation of air pockets on a sticky surface of the sheet. The point or line contact area between the component and the sheet is then gradually spread thereby pushing away the air that exists between the component and the sheet, whereby the component is smoothly adhered to the sheet without allowing air pockets to be formed. Troubles caused by the air pockets between the component and the sheet can be thus eliminated. The sticky surface or an adhesive layer for affixing the component to the sheet may be provided to one or both of the component or the sheet. The sticky surface should preferably be made of low-tack materials for easy removal of the component from the sheet in subsequent processing.

The initial point contact between the component and the sheet can be made by pressing the sheet with the distal end of a resilient member to the component, and the contact area between the component and the sheet can be spread by pressing the sheet further to the component thereby causing elastic deformation of the resilient member until the component is adhered to the sheet.

The initial line contact between the component and the sheet can be made by pressing the sheet with a circumferential surface of a roller or a flat blade of a spatula to the component, and the contact area between the component and the sheet can be spread by moving the roller or spatula in a direction orthogonal to the direction of line contact between the component and the sheet from one side of the component to the other side thereof until the entire bottom surface of the component is adhered to the sheet.

A support tape that supports the sheet can also be affixed to the sheet similarly to and in association with the process of affixing the component to the sheet without additional or special devices or operations.

The sheet should preferably be in a tape-like form so that a multiplicity of components can be continuously and efficiently affixed lengthwise to the sheet as the sheet is advanced in its lengthwise direction. Tape-like sheet is most suitable for a tape packaging system that is favorably used in continuous supply of components to a predetermined location one by one for various handling and processing.

For implementing the above method of affixing the component to the sheet, the component affixing apparatus of the present invention comprises a component feeding section for supplying components, a feeding mechanism for advancing a tape-like sheet intermittently toward a component affixing position a predetermined distance corresponding to a pitch at which components are affixed to the sheet, a component transfer mechanism for picking up the components fed at the component feeding section and for transferring the components to the component affixing position, and a resilient press member disposed opposite to the component at the component affixing position for pressing the sheet to the component that has been transferred onto the sheet, and a press means for pressing the sheet with a distal end of the resilient press member to the component so that the component and the sheet first make a point contact with each other in a point contact area, and for further pressing the sheet and the component to each other thereby causing the resilient press member to deform elastically so that the point contact area between the component and the sheet spreads toward the periphery of the component whereby the component is adhered to the sheet.

Alternatively, the component affixing apparatus of the present invention may comprise a linear spread means having a linear contact portion disposed opposite to the component at the component affixing position for linearly pressing the sheet to the component that has been transferred onto the sheet, and a press means for pressing the sheet with the linear spread means to the component so that the component and the sheet make a line contact with each other in a line contact area, and for moving the linear spread means in a direction orthogonal to the direction of line contact between the component and the sheet so that the line contact area between the component and the sheet spreads from one side of the component to the other side thereof whereby the component is adhered to the sheet.

With this apparatus a multiplicity of components can be automatically, stably, and efficiently affixed to a tape-like sheet that is fed intermittently in accordance with a predetermined program for controlling each of the means and mechanism of the apparatus.

DESCRIPTION OF THE DRAWINGS

FIGS. 1A–1C illustrate one example of the embodiment of the present invention, wherein FIG. 1A is a perspective view schematically showing the construction of the apparatus, FIG. 1B is a perspective view showing how the component is affixed to the sheet, and FIG. 1C is a cross-sectional view showing how the component and the support tape are affixed to the sheet;

FIGS. 2A and 2B illustrate another example of the embodiment of the present invention, wherein FIG. 2A is a perspective view schematically showing the construction of the apparatus, and FIG. 2B is a perspective view showing how the component is affixed to the sheet;

FIGS. 4A and 4B illustrate yet another example of the embodiment of the present invention, wherein FIG. 4A is a perspective view schematically showing the construction of the apparatus, and FIG. 4B is a perspective view showing how the component is affixed to the sheet;

BEST MODE FOR CARRYING OUT THE INVENTION

A typical embodiment of a method of affixing components to a sheet and an apparatus therefor according to the present invention in the form of specific examples is hereinafter described with reference to the accompanying drawings.

FIGS. 11A–1C, 2A, 2B, and 4A, 4B respectively show first, second, and third examples of this embodiment, wherein a multiplicity of bare IC chips 2 diced from a semiconductor wafer 1 are handled as components and affixed to a tape-like sheet 3 of a carrier tape 10 at predetermined intervals along the length of the sheet. Components packaged in this way are supplied for various subsequent processes. For example, the carrier tape 10 accommodating a multiplicity of IC chips 2 is transferred in a predetermined path for a continuous supply of components at a specific location where bumps are formed on each IC chip and/or such bumps are leveled.

Figures 1A, 1B, 1C:
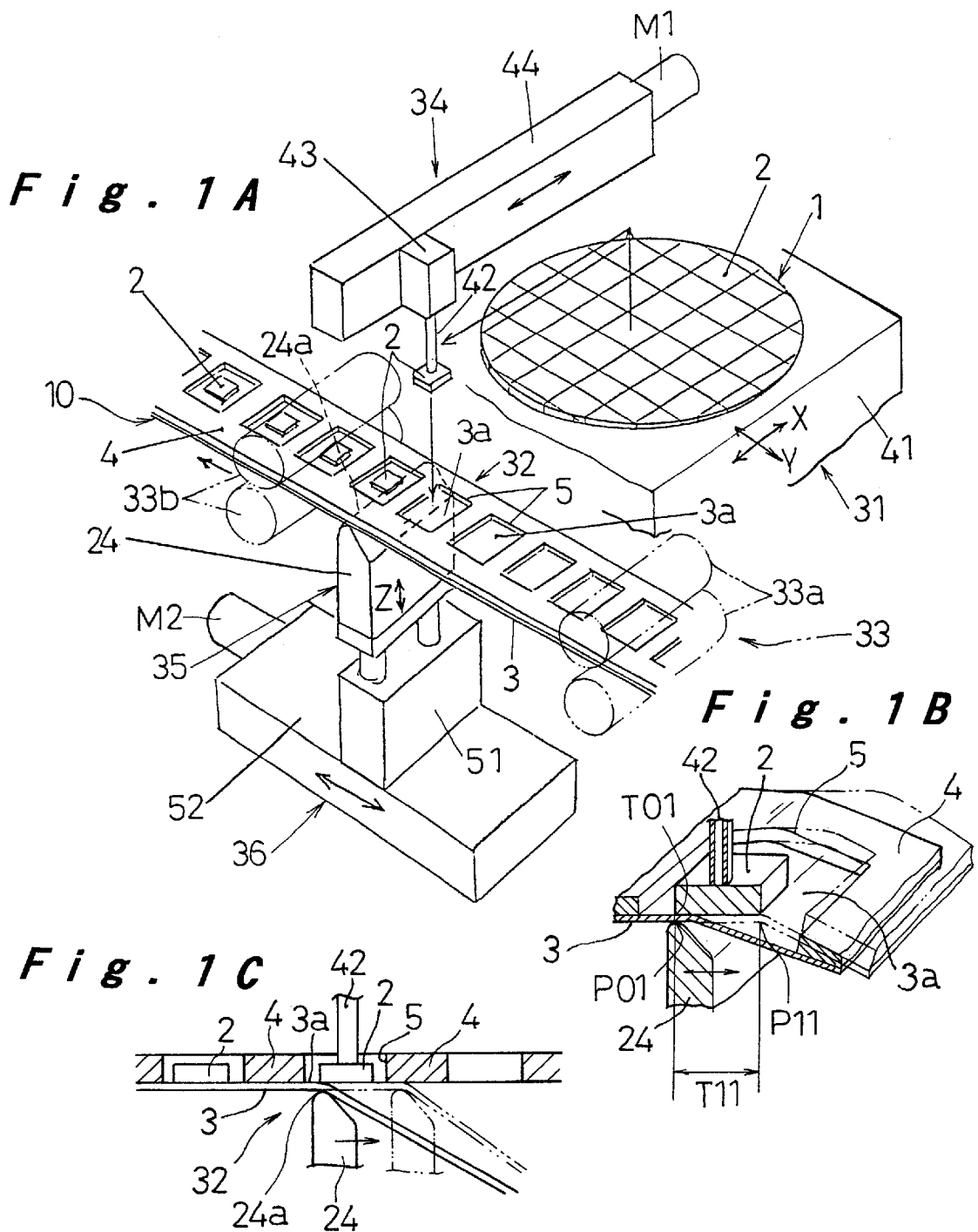

The carrier tape 10 should preferably comprise a support tape 4 affixed to the sheet 3 for providing enough rigidity during transport of the sheet. The support tape 4 covers and protects the sheet 3 but has a series of apertures 5 formed at predetermined, uniformly spaced intervals where the tacky surface 3a of the sheet 3 is revealed at positions corresponding to the series of apertures 5. The tacky surface 3a forms the bottom of the recessed cavities formed by the apertures 5 in the support tape 4 and is not exposed to the outside of the support tape 4, and therefore, the sheet 3 can be transferred by, for example, two pairs of press rollers 33a, 33b as shown in FIG. 1A. Alternatively, sprocket drive holes may be formed in the edge surface of the sheet 3 and support tape 4 which engage gear teeth of a sprocket drive for advancing the sheet 3. The sheet or carrier tape may be fed from a supply reel and wound onto another reel.

The apertures 5 provided in the support tape 4 form tub-like cavities for accommodating bare IC chips 2 stuck to the sheet 3 such as not to allow the components to protrude above the apertures 5. Bare IC chips 2 are thus protected and prevented from contacting or being pressed by other elements during sheet transport and take-up.

The tacky surface 3a should not give high level of adhesion if the bare IC chips 2 stuck on the sheet 3 are to be fed for manufacturing electronic circuit substrates after the forming or leveling of bumps provided on chips. In this embodiment the substance constituting the tacky surface 3a is not an adhesive but made of low-tack materials for facilitating removal of components from the sheet 3 when the IC chips are picked up and mounted on a mounting surface or transferred elsewhere to be aligned suitably for mounting.

It should be noted that the components can be aligned in any other arrangements and affixed on any form of sheets or can be transferred to the sheet in any other systems other than the examples given in this embodiment. For example, the present invention may also be applied to a case wherein each individual component is affixed to each individual sheet, respectively. Furthermore, the tacky surface 3a should not necessarily be made of low-tack materials and an adhesive layer can be provided instead.

Figure 2A:
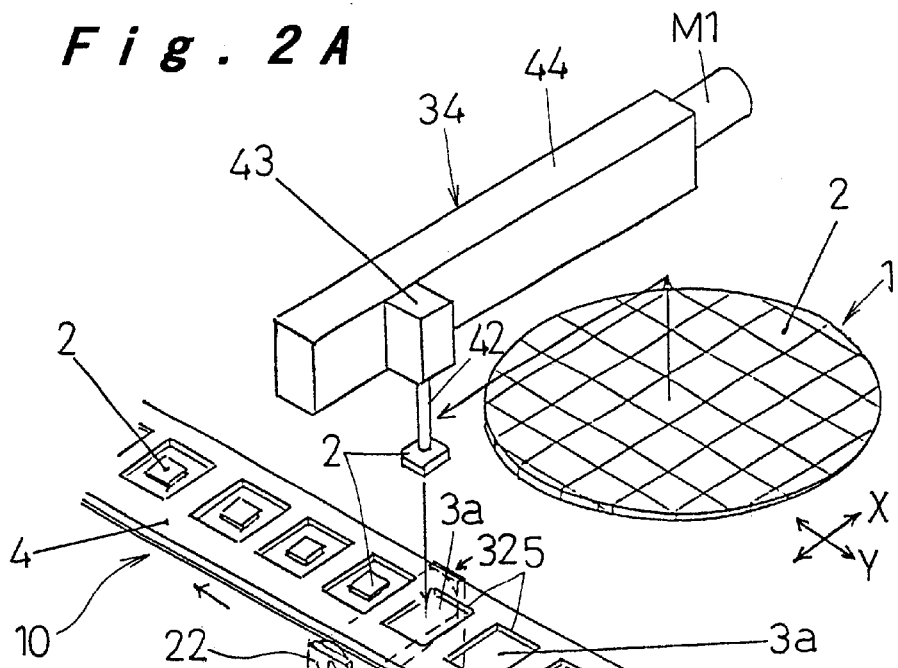
Figure 2B:
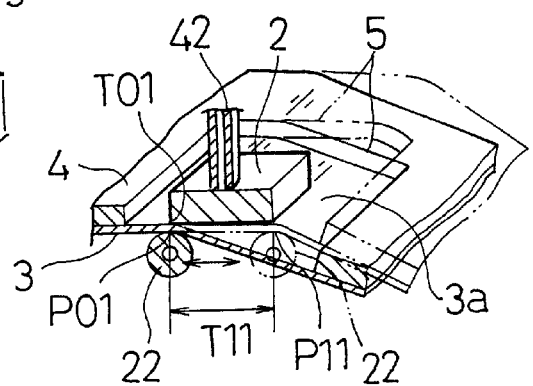
Figure 4:
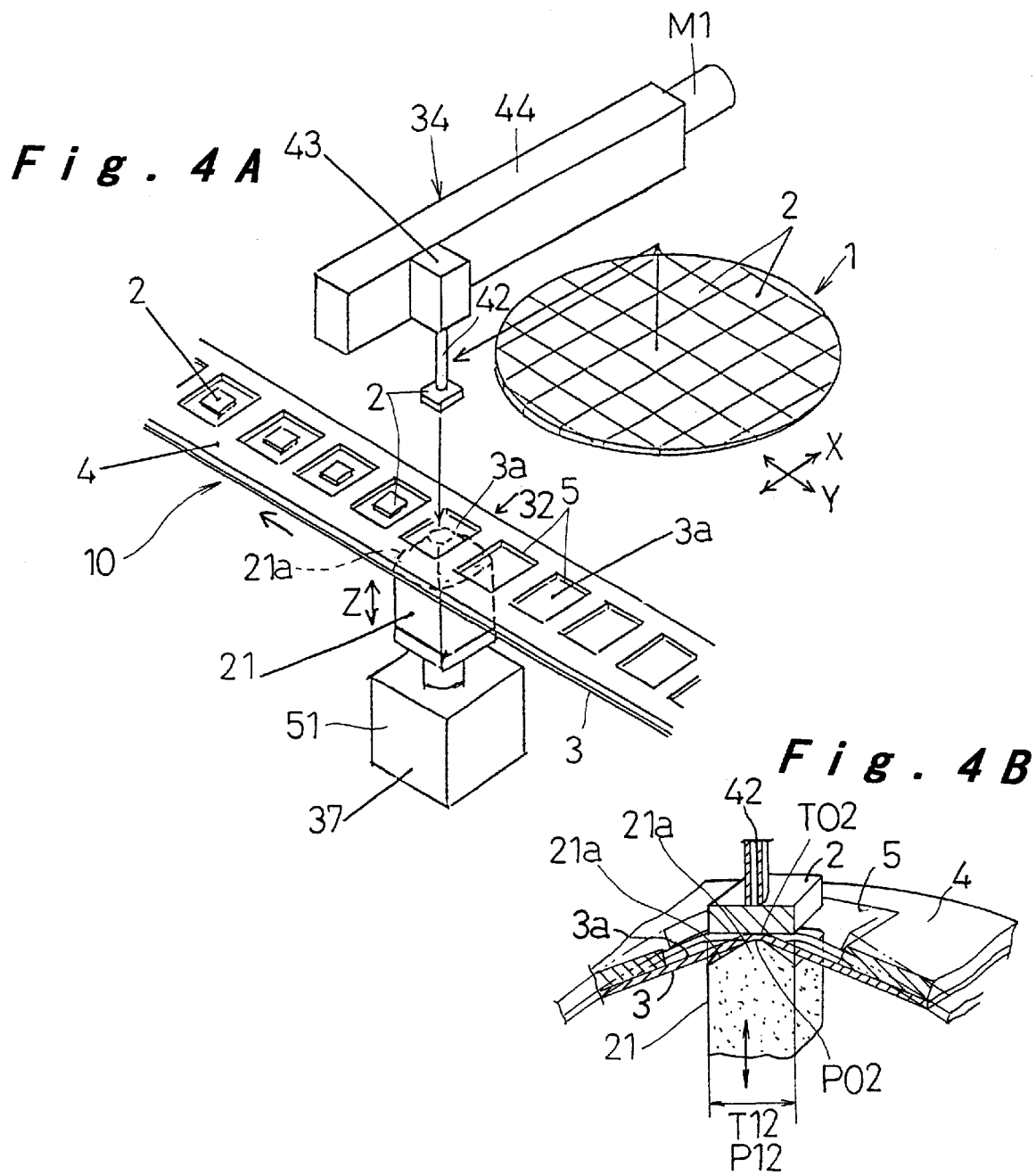

Referring to FIGS. 1A–1C, 2A, 2B, and 4A, 4B, the sheet 3 is first brought into line contact with a bare IC chip 2 at a line contact portion TO1 as shown in FIG. 1B or FIG. 2B, or into point contact with the chip 2 at a point contact portion TO2 as shown in FIG. 4B. The initial line contact portion TO1 where the sheet 3 makes line contact with the chip 2 is then gradually spread to a predetermined contact region T11 as shown in FIG. 1B or FIG. 2B, or the initial point contact portion TO2 is spread to a predetermined contact region T12 as shown in FIG. 4B, whereby the sheet 3 is affixed to the bottom surface of the IC chip 2. The predetermined contact regions T11, T12 have an area substantially equal to the entire surface of the bottom of the IC chip 2, but it can be set smaller than that. Neither the shape nor the size of the contact region is critical.

The sheet 3 is pressed to the chip 2 using a spatula 24 having a flat blade 24a shown in FIGS. 1A, 1B, or a roller 22 shown in FIGS. 2A, 2B. In the examples shown in FIGS. 1A–1C and 2A, 2B, the sheet 3 is first brought into line contact with the chip at a first contact position P01, and as the spatula 24 or roller 22 is moved in a direction orthogonal to the direction of line contact between the chip and sheet to a second contact position P11, the initial line contact portion TO1 gradually spreads to the predetermined contact region T11. Thus the initial line contact portion TO1 set at one end of the chip 2 gradually broadens toward another end of the chip until the entire bottom surface of the bare IC chip is affixed to the sheet 3 in the predetermined contact region T11.

When the bottom surface of the bare IC chip 2 is square shaped, the initial line contact portion TO1 should be set along one side of the square so as to minimize the moving distance of the spatula 24 or roller 22. Similarly, if the IC chip 2 has a rectangular bottom surface having longer sides and shorter sides, the initial line contact portion TO1 should be set along one of the longer sides of the IC chip 2.

In the third example shown in FIGS. 4A, 4B, the sheet 3 is pressed to the bottom surface of the IC chip 2 with the distal end of a tapered tip 21a of a resilient press member 21 made of elastic materials such as urethane rubber at a first contact position P02 so that the chip 2 and the sheet 3 make point contact with each other in the initial contact portion TO2. The resilient press member 21 is then pressed further toward the underside of the sheet 3, causing its tapered tip 21a to elastically deform as shown in imaginary lines in FIG. 4B, and thereby the initial point contact portion TO2 is spread in a radial direction to the circumferential part P12 of the IC chip 2 to the predetermined contact region T12.

The initial point contact portion TO2 should be set in the center of the IC chip 2 as shown in FIG. 4B so that the contact area expands evenly from the center to the periphery, whereby the IC chip 2 can be smoothly adhered to the sheet 3 in a shortest period of time. The tapered tip 21a of the resilient press member 21 of this embodiment is shaped in a quadrangular pyramid corresponding to the square shape of the bottom of the IC chip 2 as shown in FIGS. 4A, 4B. In this way, the contact area TO2 gradually broadens to the contact region T12 in a similar figure to the shape of the bottom surface of the IC chip 2 as the sheet 3 is pressed to the bottom surface of the chip 2 by the deforming resilient press member 21, and the chip 2 will be eventually adhered to the sheet 3 in the contact region T12 formed in a suitable size and shape relative to the bottom surface of the IC chip 2.

As described above, when affixing an IC chip 2 on the sheet 3, only a part of the sheet 3 is first brought in line or point contact with the IC chip 2 so as to avoid entrapment of air between the sheet 3 and chip 2. Air is easily entrapped when broad areas of both surfaces are brought into face-to-face contact instantaneously. According to the method of affixing components on the sheet of the present invention, the IC chip 2 and sheet 3 are first in contact with each other at the initial contact portion TO1 or TO2 which is extremely small in size and air pockets are hardly formed on the tacky surface 3a at the contact portion TO1 or TO2.

After this line or point contact, the contact portion TO1 or TO2 is gradually spread to the predetermined contact position PO2 or P12 as shown in imaginary lines in FIGS. 1B, 2B, and 4B, and the IC chip 2 is smoothly adhered to the sheet 3 without allowing air to remain therebetween as the contact portion TO1 or TO2 continuously broadens to the entire contact region T11 or T12.

The carrier tape 10 on which bare IC chips 2 are adhered lengthwise as described above can eliminate the problems caused by air pockets and is favorably used for the process of forming metal bumps on IC chips 2 using ultrasonic vibration. Subsequent automated handling of IC chips 2 such as bump forming or leveling processes can be performed continuously and efficiently without any troubles.

The tacky surface 3a or an adhesive for sticking IC chips 2 on the sheet 3 may be provided to one or both of the chips 2 and the sheet 3. If the IC chips 2 are to be placed on a circuit board after formation of bumps, an adhesive or sticky layer 3a should preferably be provided to the IC chip 2 so that the IC chip 2 can be provisionally tacked to another surface after it is removed from the sheet 3.

If the sheet. 3 and the support tape 4 are transferred separately to the chip affixing position 32, where they are brought into partial contact with each other similarly to and simultaneously with the process of affixing the IC chip 2 to the sheet 3, the sheet 3 and support tape 4 can be affixed together in the same principle of the above described component affixing method that does not allow formation of air pockets without any special or additional devices or processes.

The first to third examples of the component affixing apparatus respectively shown in FIGS. 1A, 2A, and 4A generally comprise a component feeding section 31 where bare IC chips 2 or die are supplied, a feeding mechanism 33 for intermittently advancing the tape-like sheet 3 forward an exact distance corresponding to the interval between two adjacent components affixed on the sheet 3 toward the chip affixing position 32, a pick-and-place assembly system 34 for picking up IC chips 2 fed at the component feeding section 31 and transferring same to the chip affixing position 32, and a linear spread means 35 having a spatula 24 or a roller 22 as shown in FIGS. 1A–1C or 2A, 2B, or alternatively, a resilient press member 21 as shown in FIGS. 4A, 4B. The linear spread means 35 causes the flat blade 24a of the spatula 24 or the circumferential surface 22a of the roller 22 to press the sheet 3 that has been fed to the chip affixing position 32 from underside opposite to the IC chip 2 so that the sheet 3 makes line contact with the IC chip 2 that has been transferred and placed thereon. The resilient press member 21 has the tapered portion 21a which is pressed to the sheet 3 from below so that the sheet 3 makes point contact with the chip 2 and as the resilient press member 21 presses the sheet 3 further the tapered portion 21a deforms and thereby the contact area between the sheet 3 and IC chip 2 spreads. The apparatus shown in FIG. 1A or FIG. 2A has a press means 36 for driving the linear spread means 35 to press the sheet 3 for line contact with the chip 2 and to move in a direction orthogonal to the direction of line contact for broadening the contact area between the chip 2 and the sheet 3 from one end of the chip 2 to the other end thereof. The apparatus shown in FIG. 4A has another type of press means 37 which drives the resilient press member 21 to press the sheet 3 for point contact with the chip 2 and to further press the sheet 3 for broadening the contact area between the chip 2 and the sheet 3 radially toward outside with the deformation of the tapered portion 21a.

The component feeding section 31 comprises an X-Y table 41 capable of moving in two, X and Y directions that cross with each other at right angles, for placing thereon the semiconductor wafer 1 and positioning a singulated die at a predetermined pick-up position for continuous supply of components. Although not shown in detail, the semiconductor wafer 1 is held on a dicing sheet that is expanded so as to spread the space between each of the diced IC chips 2 for allowing a singulated die to be easily picked up without failure.

The feeding mechanism 33 comprises two pairs of transfer rollers 33a, 33b disposed upstream and downstream of the chip affixing position 32 for intermittently advancing the sheet 3 such that a portion of the sheet 3 to which the component is affixed is paused for a predetermined time at a prescribed location in the chip affixing position 32, and during this pause IC chip 2 is adhered to the sheet 3. The press means 36 or 37 is disposed in the chip affixing position 32 so that the linear spread means 35 or resilient press member 21 stands upright below a portion of the sheet 3 to which the component is adhered, as shown in FIGS. 1A, 2A, and 4A.

The pick-and-place assembly system 34 has a transfer head 43 having a suction nozzle 42 as one example of a component handling tool for transferring chips 2 from the component feeding section 31 to the chip affixing position 32. The transfer head 43 is driven by a motor M1 and is moved along an X-axis shaft 44 whereby the suction nozzle 42 picks up IC chips 2 fed at the component feeding section 31 and transfers them to a position above the sheet 3 that is located and paused at the component affixing position 32. The suction nozzle 42 keeps the suctional hold of IC chip at the position where it is adhered to the sheet 3 until the IC chip 2 is completely affixed to the sheet 3, so that the IC chip 2 is not displaced when pressed by the linear spread means 35 or resilient press member 21 driven by the press means 36 or 37. Only after the affixing of the IC chip 2 on the sheet 3 is completed does the suction nozzle 42 release the hold of the chip 2 and move upward, which is when the transfer of an IC chip 2 onto the sheet 3 is substantially completed.

The press means 36 of the first and second examples of this embodiment shown in FIG. 1A and FIG. 2A comprises a hydraulic or solenoid-operated actuator 51 designed to move upward and downward for causing the linear spread means 35 such as the spatula 24 or the roller 22 to make contact with the sheet 3 from below, and a Y table 52 driven by a motor M2 to move the linear spread means 35 in a direction Y which is the lengthwise direction of the sheet 3. On the other hand the press means 37 of the third example of this embodiment shown in FIG. 4A is comprised of the actuator 51 only, that also supports the resilient press member 21.

Figure 3:
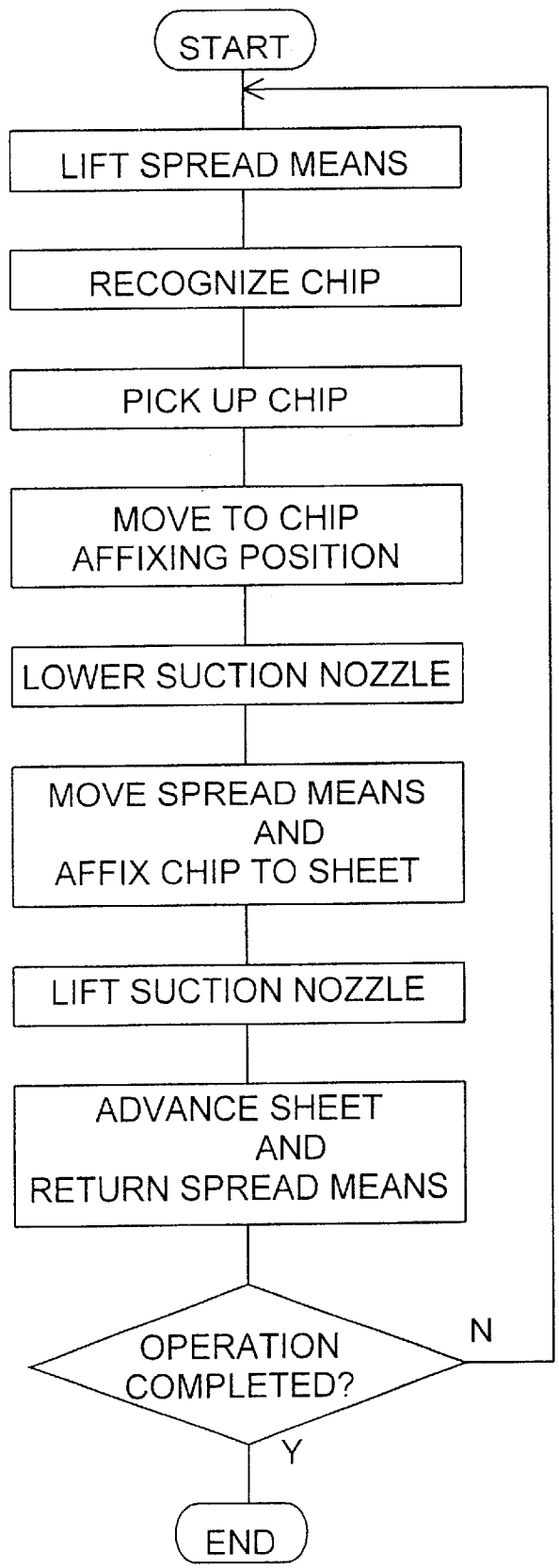
FIG. 3 is a flow chart showing the control of the apparatus shown in FIG. 1A or FIG. 2A.

FIG. 3 is a flow chart showing control of the apparatus shown in FIG. 1A or FIG. 2a. The spatula 24 or roller 22 is initially lifted in this system. The image of an IC chip 2 that is located at the component feeding section 31 is first taken for recognition of the chip. If the chip is the desired type of component, it is picked up by the suction nozzle 42 of the transfer head 43, which then moves to the chip affixing position 32 and lowers the suction nozzle 42. At this time the suction nozzle 42 keeps the hold of the chip 2 at a predetermined height above the component affixing position on the sheet 3 which is paused at the component affixing station 32.

The predetermined height of the suction nozzle is set such that the bottom surface of the IC chip 2 is positioned at a height half the thickness of the sheet 3. The sheet 3 at this time is held or pressed from below by the flat blade 24a of the spatula 24 or the circumferential surface 22a of the roller 22. The initial line contact between the bottom surface of the IC chip 2 and the tacky surface 3a of the sheet 3 is thus made as shown in FIG. 1C. At the time of this initial line contact, air is hardly entrapped between the IC chip 2 and the sheet 3.

The press means 36 is then moved in the direction Y so as to press the sheet 3 continuously onto the bottom surface of the IC chip 2 from one side to the other such as to push out air between the both. In this way the IC chip 2 is continuously contacted with and adhered to the sheet 3 without formation of air pockets therebetween. After that the suction nozzle 42 is moved upward while the sheet 3 is advanced a predetermined distance, and the press means 36 is returned in the direction Y. The linear spread means 35 such as the spatula 24 or roller 22 stays at its lifted position, but when it is necessary to lower the linear spread means 35, it may be lowered during such movement of the press means 36 in the direction Y.

The operation is completed when a required number of chips have been adhered to the sheet, or a predetermined time has lapsed, or the apparatus is stopped by an operator. The control accordingly ends if the operation is completed. If not, the next chip 2 located in position at the component feeding section 31 is subject to image recognition, and the subsequent steps are repeated.

Preferably, the sheet 3 and support tape 4 are separately fed toward the chip affixing position 32 .and affixed together as shown in FIG. 1C. In this way, the sheet 3 can be affixed to both of the IC chips 2 and the support tape 4 by the control shown in the flow chart of FIG. 3 without entrapment of air. However, the sheet 3 and the support tape 4 can be affixed to each other by merely advancing them together without moving linear spread means 35 in the direction Y. For the linear spread means 35, the roller 22 has the advantage of causing less friction between itself and the sheet 3.

Figure 5:
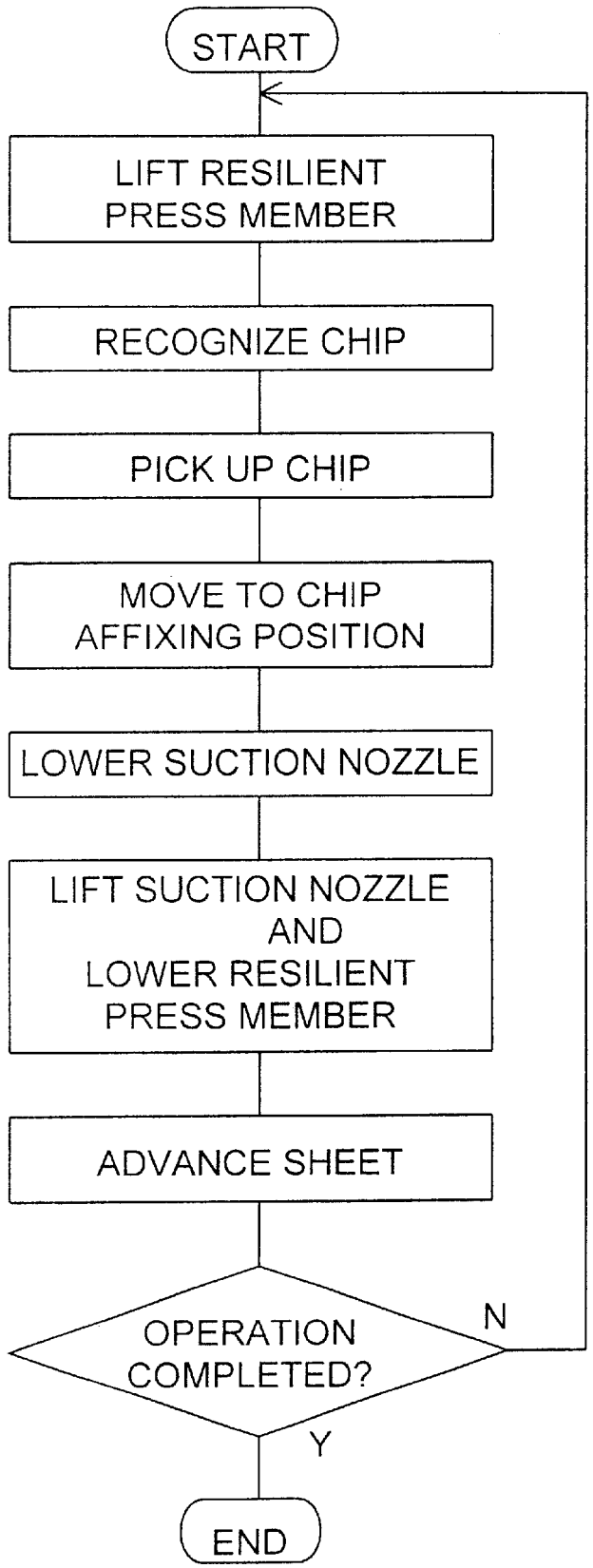
FIG. 5 is a flow chart showing the control of the apparatus shown in FIG. 4A.
Figure 6:
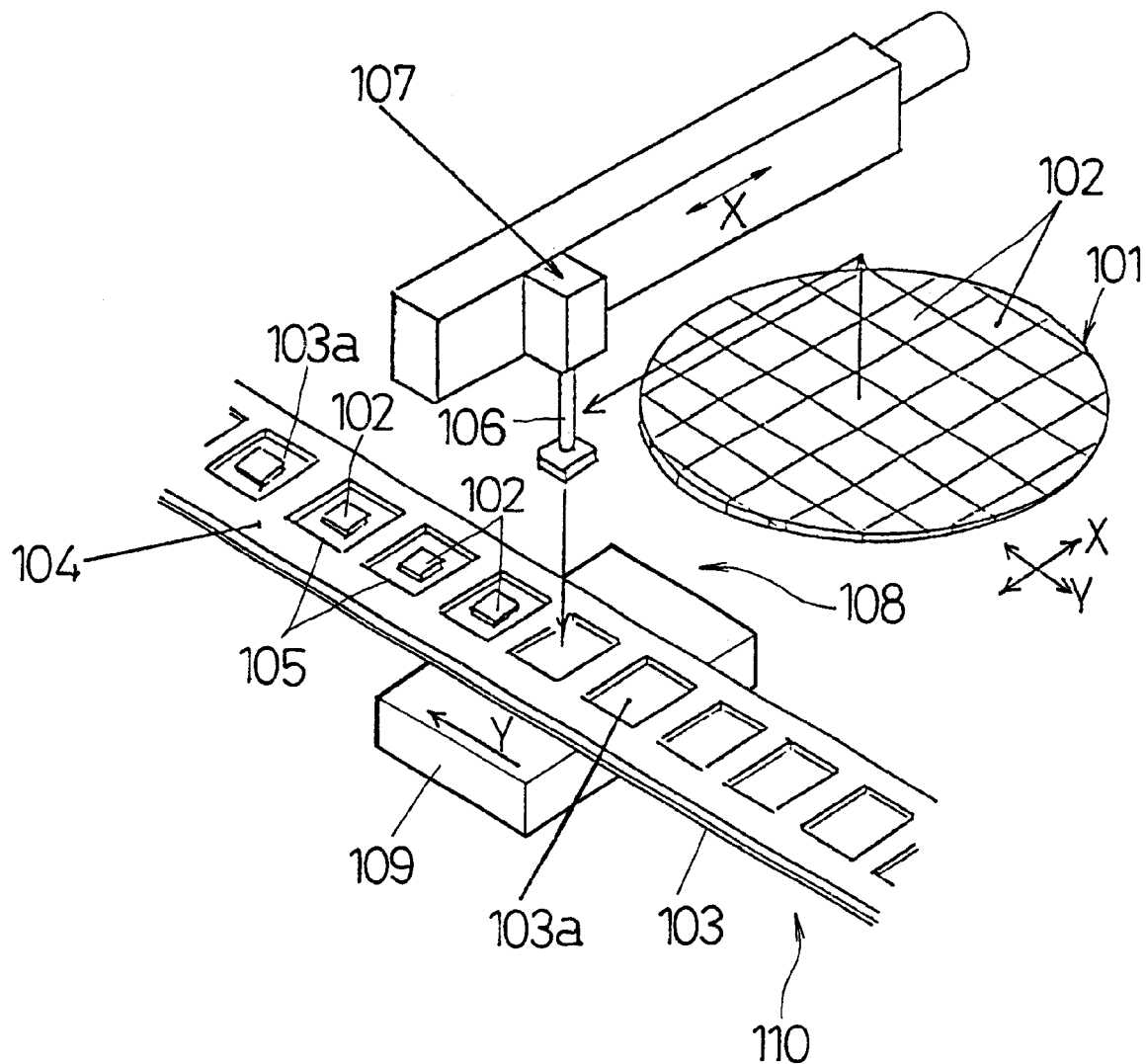
FIG. 6 is a perspective view schematically showing the construction of a prior art component affixing apparatus.

FIG. 5 is a flow chart showing the control of the apparatus shown in FIG. 4A. In this system the resilient press member 21 is first lifted to a predetermined height. The height of the resilient press member 21 is set such that the distal end of the tapered portion 21a is positioned slightly above the underside of the sheet 3 which is fed to and paused at the component affixing station 32. Such height should be suitably set depending on the size of the component, the shape of the resilient press member 21, and the material and thickness of the sheet 3. By way of example, in a case where the IC chip 2 is 4 mm square, the resilient press member 21 is made of rubber of 6 hardness in the shape of 120 quadrangular pyramid, and the sheet 3 is made of polyethylene terephthalate having a thickness of 38 $\mu$m, the height of the distal end of the tapered portion 21a is set 1 $\mu$mm above the underside of the sheet 3. The sheet 3 is thus slightly pushed upward by the tapered portion 21a of the resilient press member 21 as shown in FIG. 4B.

The image of the IC chip 2 located at the component feeding section 31 is then taken for recognition thereof, and if it is the desired type of component, the chip 2 is picked up by the suction nozzle 42 of the transfer head 43. The transfer head 43 moves to the chip affixing position 32 and lowers the suction nozzle 42 to a predetermined height. Specifically, the suction nozzle 42 is lowered until the bottom surface of the IC chip 2 reaches a position corresponding to the upper surface of the sheet 3 before it is pushed upward by the resilient press member 21. The IC chip 2, as it is lowered, is thus brought into point contact with the peak of the pointed sheet 3 pushed upward by the tapered portion 21a of the resilient press member 21 as shown in solid lines in FIG. 4B.

The IC chip 2 is then lowered further, pushing through the sheet 3 the tapered portion 21a of the resilient press member 21 and causing it to deform elastically as shown in imaginary lines in FIG. 4B, whereby IC chip 2 gradually contacts the sheet 3, and, eventually its entire bottom surface is adhered to the sheet 3. It should be noted that either one or both of the resilient press member 21 and the component such as the IC chip may be moved for bringing the chip 2 and the sheet 3 into contact with each other.

The suction nozzle 42 is then lifted, while the resilient press member 21 is lowered, and the sheet 3, being freed from the resilient press member 21, is advanced a predetermined pitch.

The operation is completed when a required number of chip have been adhered to the tape, or a predetermined time has lapsed, or the apparatus is stopped by an operator. The control accordingly ends if the operation is completed. If not, the next chip 2 located in position at the component feeding section 31 is subject to image recognition, and the subsequent steps are repeated.

INDUSTRIAL APPLICABILITY

As described above, the present invention comprises an improved method and apparatus for affixing small components on a tape-like sheet wherein the component is first brought into point or line contact with the sheet for avoiding air entrapment therebetween and is then gradually contacted with the sheet. The present invention thus enables continuous supply of components in subsequent handling and processing without troubles caused by air pockets between the component and the sheet.

What is claimed is:

1. A component affixing apparatus having a component feeding section (31) for supplying components (2),
    a feeding mechanism (33) for intermittently advancing a tape-like sheet (3) having an adhesive surface toward a component affixing position (32) by a predetermined distance at a time corresponding to a pitch at which components are to be affixed to the sheet,
    a component transfer mechanism (34) for picking up the components fed by the component feeding section (31) and for transferring the components to the component affixing position (32), and
    a resilient press member (21) disposed opposite to the component at the component affixing position with the sheet there between for pressing the sheet (3) to the component (2) to transfer it to the adhesive surface of the sheet,
    characterised in that the resilient press member (21) is a solid resilient press member having a distal tapered or pointed end for pressing the sheet to the component, and
    a press means (37) is provided to move the entire resilient press member (21) toward and away from the sheet,
    wherein, when the resilient press member is moved toward the sheet, the distal end moves the sheet toward the component until the sheet contacts the component at a point contact area (T02) whereby further movement of the press means (37) toward the sheet causes the resilient press member to elastically deform thereby spreading the contact area between the component and the sheet toward the periphery of the component thereby affixing the component to the sheet.

2. The component affixing apparatus according to claim 1, wherein the components are square IC chips and the distal end of the resilient press member (21) has a quadrangular pyramid shape.

3. A bump bonder for forming metal bumps on IC chips including the component affixing apparatus of claim 1 to affix chips to a tape-like sheet to minimise or eliminate the formation of air bubbles between the sheet and metal bump forming means which forms metal bumps on electrodes of the chips affixed to the sheet using ultrasonic vibration.

4. component affixing method for affixing components (2) to a tape-like sheet (3) having an adhesive surface comprising the steps of:
    supplying components (2) to a component feeding section (31),
    intermittently advancing the sheet toward a component affixing position (32),
    picking up the components, one at a time, from the component feeding section and transferring the components to the component affixing position,
    pressing the sheet to a component at the component affixing position with a resilient press member (21) to transfer the component to the adhesive surface of the sheet,
    characterised in that a press means (37) moves the entire resilient press member toward and away from the sheet, the resilient press member is a solid resilient press member having a tapered or pointed end and, during movement of the resilient press member towards the sheet, by the steps of:
        moving the resilient press member towards the sheet thereby moving the sheet toward the component with the distal end of the resilient press member until the sheet contacts the component at a point contact area (T02), and
        further moving the press means toward the sheet to thereby cause the resilient press member to elastically deform thereby spreading the contact area between the component and the sheet toward the periphery of the component to affix the component to the sheet.

5. A bump bonding method for forming metal bumps on IC chips using a bump bonder, wherein the component affixing method of claim 4 is used to affix chips to a tape-like sheet to minimise or eliminate the formation of air bubbles between the sheet and the chips prior to the step of forming metal bumps on electrodes of the chips using ultrasonic vibration.

6. A bump bonder for forming metal bumps on IC chips including the component affixing apparatus of claim 2 to affix chips to a tape-like sheet to minimise or eliminate the formation of air bubbles between the sheet and metal bump forming means which forms metal bumps on electrodes of the chips affixed to the sheet using ultrasonic vibration.

* * * * *

UNITED STATES PATENT AND TRADEMARK OFFICE
CERTIFICATE OF CORRECTION

PATENT NO. : 6,370,750 B1
DATED : April 16, 2002
INVENTOR(S) : N. Matsumura et al.

It is certified that error appears in the above-identified patent and that said Letters Patent is hereby corrected as shown below:

Column 9,
Line 20, delete "(31)" and "(2)".
Line 21, delete "(33)".
Line 22, delete "(3)".
Line 23, delete "(32)".
Line 26, delete "(34)".
Line 27, delete "(31)".
Line 29, delete "(32)".
Line 30, delete "(21)".
Line 32, delete "(3)".
Line 33, delete "(2)".
Line 35, "press member (21) is a" should be -- press member comprises a --.
Line 37, "," should be -- ; --.
Line 39, "means (37) is provided to move" should be -- means for moving --.
Line 40, delete "(21)".
Line 40, "," should be -- ; --.
Line 44, delete "(T02)".
Line 45, delete "(37)".
Line 52, delete "(21)".

Column 10,
Line 7, before "component" insert -- A --, and after "components" delete "(2)".
Line 8, delete "(3)".
Line 9, delete "the steps of".
Line 10, delete "(2)".
Line 11, delete "(31)" and insert -- ; --.
Line 13, delete "(32)," and insert -- ; --.
Line 16, "," should be -- ; --.
Line 18, delete "(21)".
Line 20, "," should be -- ; --.
Line 21, "characterised in that a press means (37) moves" should be -- moving --.
Line 23, "is" should be -- comprising --.
Lines 24-25, "a tapered or pointed end and, during movement" should be -- a tapered end wherein the moving --.
Line 26, "Sheet, by the steps of" should be -- sheet comprises --.

UNITED STATES PATENT AND TRADEMARK OFFICE
CERTIFICATE OF CORRECTION

PATENT NO. : 6,370,750 B1
DATED : April 16, 2002
INVENTOR(S) : N. Matsumura et al.

It is certified that error appears in the above-identified patent and that said Letters Patent is hereby corrected as shown below:

<u>Column 10 (cont.),</u>
Line 30, after "area" insert -- ; --.
Line 31, delete "(T02),".

Signed and Sealed this

Eighteenth Day of February, 2003

JAMES E. ROGAN
*Director of the United States Patent and Trademark Office*